United States Patent
Ge et al.

(10) Patent No.: US 10,324,241 B2
(45) Date of Patent: Jun. 18, 2019

(54) CRYSTAL COATING OPTICAL LOW PASS FILTER AND MANUFACTURING METHOD THEREOF

(71) Applicant: ZHEJIANG MDK MODERN OPTICAL CO., LTD, Wenling (CN)

(72) Inventors: Wenzhi Ge, Hangzhou (CN); Wenqin Ge, Wenling (CN); Yiwei Wang, Suzhou (CN); Hirokazu Yajima, Tokyo (JP); Leilei Shan, Shenzhen (CN)

(73) Assignee: ZHEJIANG MDK MODERN OPTICAL CO., LTD, Wenling (CN)

( * ) Notice: Subject to any disclaimer, the term of this patent is extended or adjusted under 35 U.S.C. 154(b) by 79 days.

(21) Appl. No.: 15/682,556

(22) Filed: Aug. 22, 2017

(65) Prior Publication Data
US 2017/0371080 A1    Dec. 28, 2017

(30) Foreign Application Priority Data

Jun. 22, 2016    (CN) .......................... 2016 1 0471398

(51) Int. Cl.
| | |
|---|---|
| *G02B 5/20* | (2006.01) |
| *C03C 17/00* | (2006.01) |
| *C03C 19/00* | (2006.01) |
| *G02B 1/02* | (2006.01) |
| *G02B 1/11* | (2015.01) |
| *H01L 27/146* | (2006.01) |

(52) U.S. Cl.
CPC ............ *G02B 5/208* (2013.01); *C03C 17/002* (2013.01); *C03C 19/00* (2013.01); *G02B 1/02* (2013.01); *G02B 1/11* (2013.01); *H01L 27/1462* (2013.01); *H01L 27/14685* (2013.01); *C03C 2217/73* (2013.01); *C03C 2217/74* (2013.01); *C03C 2218/116* (2013.01); *C03C 2218/151* (2013.01)

(58) Field of Classification Search
CPC ... G02B 5/20; G02B 1/02; G02B 1/11; G02B 5/208; C03C 17/00; C03C 19/00; C03C 17/002; C03C 2218/151; C03C 2218/116; C03C 2217/74; C03C 2217/73; H01L 27/146; H01L 27/1462; H01L 27/14685
USPC ......................................................... 359/361
See application file for complete search history.

(56) References Cited

U.S. PATENT DOCUMENTS

2014/0091419 A1*  4/2014  Hasegawa ............ G02B 13/004
                                                                257/432

* cited by examiner

*Primary Examiner* — Wen Huang
(74) *Attorney, Agent, or Firm* — Gokalp Bayramoglu

(57) ABSTRACT

The present invention discloses a crystal coating optical low pass filter, which includes a UV-IR cut-off film, a crystal plate, an ink layer, and an AR film. The UV-IR cut-off film can be replaced with an IR film. By coating the crystal plate with ink having infrared absorbing effect to form an ink layer, the present invention possesses both the birefringence characteristic of the crystal and the effect similar to infrared absorbing glass. Compared with the traditional OLPF using infrared absorbing glass, the thickness of the product is reduced and the situation that the infrared absorb glass is fragile and has a poor resistance to drop is significantly improved. The present invention can be used in smartphones, digital cameras, in-vehicle cameras, security cameras and has a large space of marketing.

9 Claims, 2 Drawing Sheets

CRYSTAL COATING OPTICAL LOW PASS FILTER AND MANUFACTURING METHOD THEREOF

CROSS REFERENCE TO RELATED APPLICATION

This application is based upon and claims priority to Chinese Patent Application No. 201610471398.6, filed on Jun. 22, 2016, the entire content of which is incorporated herein by reference.

FIELD OF THE INVENTION

The present invention relates to the technical field of optical low pass filter, more particularly, to the crystal coating optical low pass filter and the manufacturing method thereof.

BACKGROUND OF THE INVENTION

Normally, the optical low pass filter is made of two or more pieces of quartz crystal plates and located in front the CCD sensor. The beam of the target image information generates birefringence after paving the OLPF. Based on the pixel size of the CCD and the total photosensitive area, the sampling cut-off frequency is calculated and the separation distance between the o light and the e light can also be calculated. Changing the incident beam will form a target frequency with a difference frequency, so as to achieve the purpose of reducing or eliminating low-frequency interference fringes, especially, pseudo-color interference fringes occurred in color CCD.

In addition, when color scenes are photographed using a CCD or a CMOS image sensor, since the response of the image sensor to colors is different from that of the human eyes, it is necessary to remove the infrared part which can be detected by the image sensor but cannot be detected by the human eyes, and adjust the response to the colors in the range of visible lights, so that the colors presented in the images are in line with the feeling of the human eyes. Therefore, a piece of infrared absorbing glass is generally added in the middle of the OLPF chip to obtain excellent results. However, the thickness of the product is increased.

Therefore, how to thin the optical low pass filter is a problem to be solved urgently.

SUMMARY OF THE INVENTION

To this end, the present invention provides a crystal coating optical low pass filter. An effect similar to infrared absorbing glass is achieved by coating the crystal plate with ink. Compared with the traditional OLPF using infrared absorbing glass, the thickness of the product is reduced and the situation that the infrared absorbing glass is fragile and has a poor resistance to drop is significantly improved while the properties of the crystal are still kept.

In order to achieve above objectives, the present invention provides the following technical solutions.

A crystal coating optical low pass filter includes u UV-IR cut-off film, a crystal plate, an ink layer, and an AR film, wherein the UV-IR cut-off film can be replaced with an IR film.

Preferably, in above crystal coating optical low pass filter, in view of different types of CCD and CMOS image sensors and the noises caused in different directions, the crystal plate can be replaced by any combination of crystal plates with different thicknesses, numbers, and angles, wherein the crystal plates are adhered by UV gel.

Preferably, in above crystal coating optical low pass filter, the ink layer is coated on the crystal plate by a spin-coating device and the ink used has an infrared absorbing effect.

Preferably, in above crystal coating optical low pass filter, the UV-IR cut-off film, the AR film, and the IR film are evaporated by the vacuum coating device.

A method for manufacturing a crystal coating optical low pass filter includes the following steps:

(1) original stone cutting: cutting off a crystal at a 45° angle with respect to the Z axis of the crystal;

(2) grinding of crystal: ① rough grinding: under a condition that grinding pressure and grinding speed are controlled, for the cut-off crystal, rough grinding material is used to process the thickness of the crystal plate such that the thickness and parallelism degree of the crystal meet the designated requirements; ② fine grinding: under a condition that grinding pressure and grinding speed are controlled, a fine grinding material is used to process the roughly grinded crystal plate to further make the thickness and parallelism degree of the crystal plate meet the designated standards; ③ polishing: under a condition that the pressure and revolving speed of a polishing disk are controlled, polishing powder-water solution is used to process the thickness of the finely grinded crystal plate to make the thickness, parallelism degree, and aperture of the crystal plate meet the designated indexes;

(3) cleaning of crystal plate: an automatic cleaning machine is used to clean the appearance of the crystal plate that is subject to the process in step (2);

(4) coating of crystal plate: ink is coated on the surface of the crystal plate; first, the number and time of revolution of the spin-coating device is adjusted, and the amount of ink to be coated on the crystal plate is controlled; theft, heat treatment is performed; finally, baking is performed to obtain a semi-finished product; by controlling the amount of ink coated, baking temperature, and baking time in step (4), the final product complies with the required spectral, curve, and the half-value deviation of the spectrum is accurately controlled to be within ±1%;

(5) inspection and cleaning of semi-finished product: first, the appearance and the uniformity of the optical property distribution of the semi-finished product prepared in step (4) are inspected; then no-damage cleaning is performed to finalize the production of ink coating crystal plate.

(6) film coating: the vacuum coating device is used to perform film coating on the crystal plate at a normal or high temperature in the tolerance range of the ink to meet the usage requirement of the user.

Preferably, in above method for manufacturing a crystal coating optical low pass filter, regarding the ink coating on the surface of the crystal plate in step (4), whether pre-processing is required is determined according so the visible light transmittance, the heat resistance, and the like of the product; the pre-processing includes the following steps. Firstly, the number of revolutions of the spin-coating device is adjusted, then the pre-processing liquid is applied on the crystal plate, then heat treatment is performed; ink is coated after the pre-processing is finished.

Preferably, in above method for manufacturing a crystal coming optical low pass filler, in step (4), the number of revolutions of the spin-coating device is set to be 500 rpm~4000 rpm.

Preferably, in above method for manufacturing crystal coating optical low pass filter, in step (4), the baking temperature is set to be 85° C.~400° C.

Preferably, in above method for manufacturing a crystal coating optical low pass filter, in step (5), the thickness of the ink coaling crystal plate may be less than 0.1 mm.

As can be seen from the above technical solutions, compared with the prior arts, the present invention discloses a crystal coating optical low pass filter. On one hand, the infrared absorbing glass that is traditionally used is replaced by a crystal plate coated with ink. Not only the thickness of the product is reduced, but also the situation that the traditional infrared absorbing glass is fragile and has a poor resistance to drop is significantly improved. On the other hand, in the process of manufacturing an ink coating crystal plate, whether pre-processing is required is determined according to the visible light transmittance, the heal resistance, and the like of the product. This not only ensures that the deviation of ink coated on the surface is within an allowable range such that the half-value deviation of the spectrum is accurately controlled to be within ±1%, but also situations such as dust adhesion and buckling can be avoided in the production of the ink coaling crystal plate. Nowadays, the thickness of the ink coating crystal plate may be less than 0.1 mm such that the overall product quality is improved.

BRIEF DESCRIPTION OF THE DRAWINGS

In order to more clearly illustrate the technical solutions in the embodiments of the present invention or prior arts, the drawings are used in the description of the embodiments or prior arts will be simply introduced below. Obviously, the drawings below are just the examples of the present invention. For those skilled in the art, other drawings can be obtained based on the drawings without creative work.

In FIG. 1:

1' indicates UV-IR cut-off film or IR film, 21' indicates −45° crystal plate, 22' indicates 0° crystal plate, 23' indicates +45° crystal plate, 4' indicates AR film.

Figure 1:
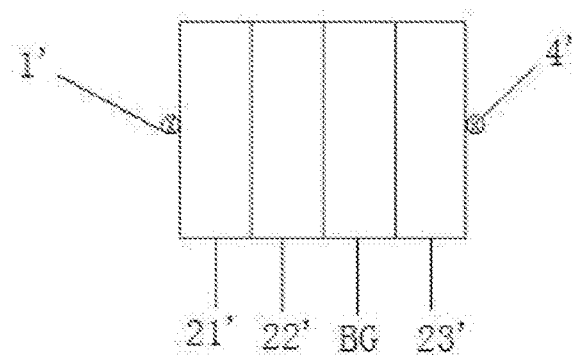
FIG. 1 is a structural schematic diagram of a conventional crystal coating optical low pass filter.
Figure 2:
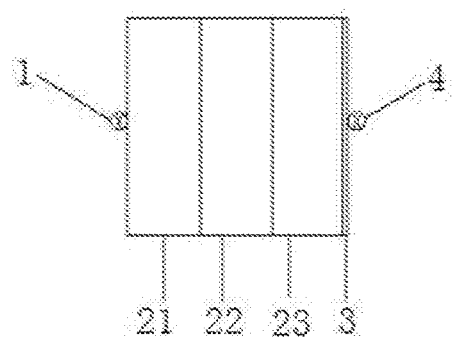
FIG. 2 is a structural schematic-diagram of embodiment 1 of the present invention.
Figure 3:
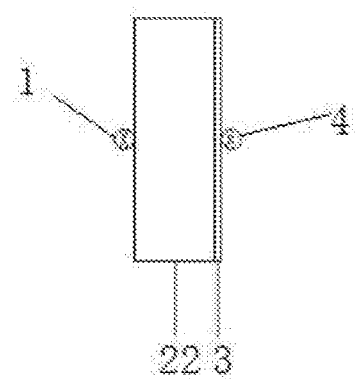
FIG. 3 is a structural schematic diagram of embodiment 2 of the present invention.
Figure 4:
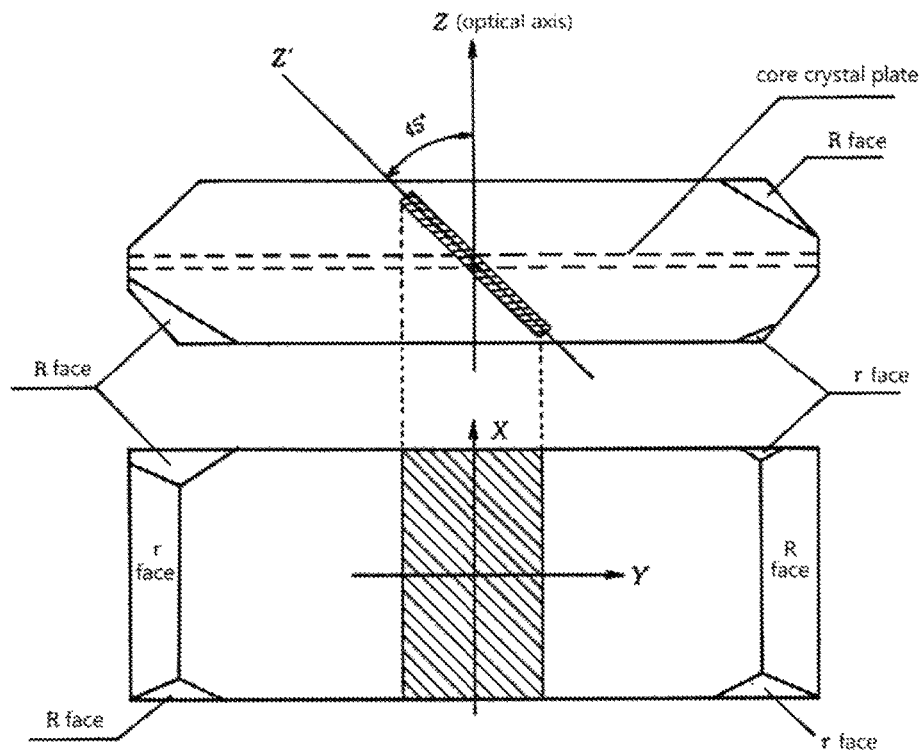
FIG. 4 is a schematic diagram of original stone cutting.
Figure 5:
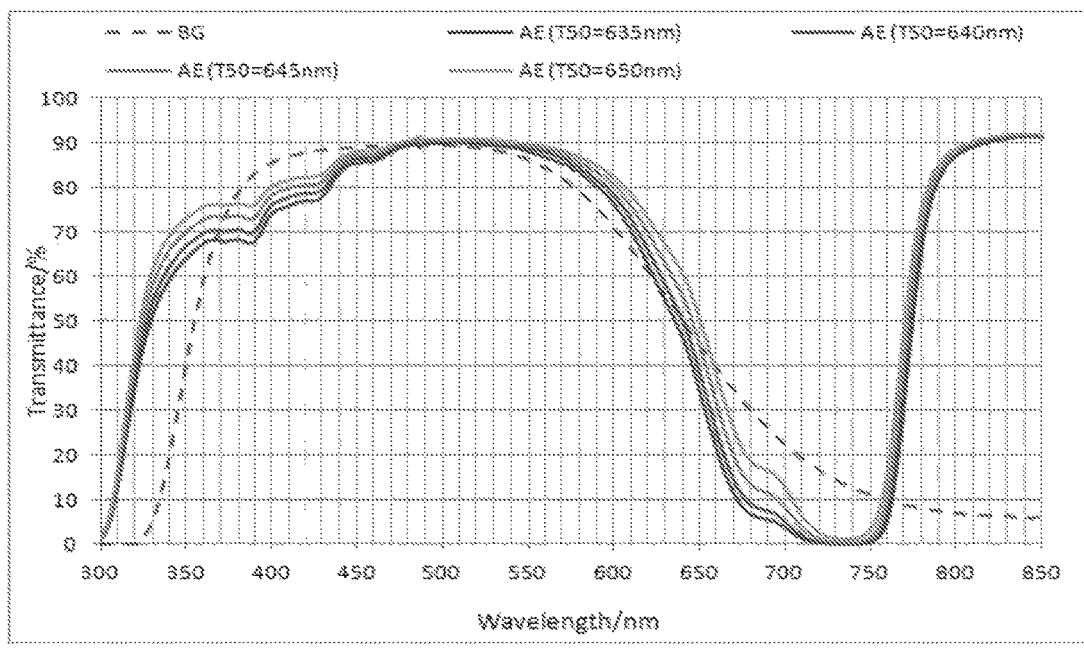
FIG. 5 is a diagram of property comparison between the present invention and traditional product.

In FIG. 2:

1 indicates UV-IR cut-off film or IR film, 21 indicates −45° crystal plate, 22 indicates 0° crystal plate, 23 indicates +45° crystal plate, 3 indicates ink layer, 4 indicates AR film.

DETAILED DESCRIPTION OF THE INVENTION

The technical solutions in the embodiments of the present invention will be described clearly and completely thereafter in conjunction with the drawings in the embodiments of the present invention. Obviously, the described embodiments are only certain embodiments of the present invention, not all of them. Based on the embodiments of the present invention, other embodiments obtained by those skilled in the art without, creative work fall within the scope of the present invention.

An embodiment of the present invention discloses a crystal coating optical low pass filter, which uses an ink coating crystal plate instead of traditional glass such that the filter possesses both the birefringence characteristic of the crystal and the effect similar to infrared absorbing glass. Compared with the traditional OLPF using infrared absorbing glass, the thickness of the product is reduced and the situation that the infrared absorbing glass is fragile and has a poor resistance to drop is significantly improved.

The present invention provides a crystal coating optical low pass filter, which includes: UV-IR cut-off film 1, a crystal plate, ink layer 3, and AR film 4, wherein UV-IR cut-off film 1 can be replaced with an IR film.

In order to further optimize above technical features, in view of different types of CCD and CMOS image sensors and the noises caused in different directions, the crystal plate can be replaced by any combination of crystal plates with different thicknesses, numbers, and angles, wherein crystal plates are adhered by UV gel.

In order to further optimize above technical features, ink layer 3 is coated on the crystal plate by a spin-coating device and the ink used has an infrared absorbing effect.

In order to further optimize above technical features, UV-IR cut-off film 1, AR film 4, and the IR film are evaporated by the vacuum coating device.

A method for manufacturing a crystal coating optical low pass filter includes the following steps:

(1) original stone cutting: cutting off a crystal at a 45° angle with respect to the Z axis of the crystal;

(2) grinding of crystal: ① rough grinding: under a condition that grinding pressure and grinding speed are controlled, for the cut-off crystal, rough grinding material is used to process the thickness of the crystal plate such that the thickness and parallelism degree of the crystal meet the designated requirements; ② fine grinding: under a condition that grinding pressure and grinding speed are controlled, fine grinding material is used to process the roughly grinded crystal plate to further make the thickness and parallelism degree of the crystal plate meet the designated standards; ③ polishing: under a condition that the pressure and revolving speed of a polishing disk are controlled, polishing powder-water solution, is used to process the thickness of the finely grinded crystal plate to make the thickness, parallelism degree, and aperture of the crystal plate meet the designated indexes;

(3) cleaning of crystal plate: automatic cleaning machine is used to clean the appearance of the crystal plate that is subject to the process in step (2);

(4) coating of crystal plate: ink is coated on the surface of the crystal plate; first, the number and time of revolutions of the spin-coating device are adjusted, and the amount of ink to be coated on the crystal plate is controlled; then, heat treatment is performed; finally, baking is performed to obtain a semi-finished product; by controlling the amount of ink coated, baking temperature, and baking time in step (4), the final product complies with the required spectral curve, and the half-value deviation of the spectrum is accurately controlled to be within ±1%;

(5) inspection and cleaning of semi-finished product: first, the appearance and the uniformity of the optical property distribution of the semi-finished product prepared in step (4) are inspected; then no-damage cleaning is performed to finalize the production of ink coating crystal plate.

(6) film coating: the vacuum coating device is used to perform film coating on the crystal plate at a normal or high temperature in the tolerance range of the ink to meet the usage requirements of the user.

In order to further optimize above technical features, regarding the ink coating on the surface of the crystal plate in step (4), whether pre-processing is required is determined according to the visible light transmittance, the heat resistance, and the like of the product; the pre-processing includes the following steps, firstly, the number of revolutions of the spin-coating device is adjusted, then the pre-processing liquid is applied on the crystal plate, then heat treatment is performed; and ink is coated a tier the pre-processing is finished.

In order to further optimize above technical features, in step (4), the number of revolutions of the spin-coating device is set to be 500 rpm~4000 rpm.

In order to further optimize above technical features, in step (4), the baking temperature is set to be 85° ~400° C.

In order to further optimize above technical features, in step 5), the thickness of the ink coating crystal plate may be less than 0.1 mm.

Embodiment 1

Referring to the related drawings, the present invention provides a crystal coating optical low pass filler, which includes: UV-IR cut-off film 1, crystal plates, ink layer 3, and AR film 4; wherein UV-IR cut-off film 1 can be replaced with an IR film.

In order to further optimize above technical features, the crystal plates include −45° crystal plate 21, 0° crystal plate 22, and crystal plate 23; UV-IR cut-off film 1 or an IR film is provided on the outer surface of −45° crystal plate 21, ink layer 3 is attached to the outer surface of +45° crystal plate 23; wherein crystal plates 2 are adhered by UV gel.

In order to further optimize above technical features, in view of different types of CCD and CMOS image sensors and the noises caused in different directions, the crystal plates can be replaced by any combination of crystal plates with different thicknesses, numbers, and angles.

In order to further optimize above technical features, ink layer 3 is coated on the crystal plate 23 by a spin-coating device and the ink used has an infrared absorbing effect.

In order to further optimize above technical features, UV-IR cut-off film 1, AR film 4, and the IR film are evaporated by the vacuum coating device.

A method for manufacturing a crystal coating optical low pass filter includes the following steps:
(1) original stone cutting: cutting off a crystal at a 45° angle with respect to the Z axis of the crystal;
(2) grinding of crystal: ① rough grinding: under a condition that grinding pressure and grinding speed are controlled, for the cut-off crystal, rough grinding material is used to process the thickness of the crystal plates such that the thickness and parallelism degree of the crystal meet the designated requirements; ② fine grinding: under a condition that grinding pressure and grinding speed are controlled, fine grinding material is used to process the roughly grinded crystal plates to further make the thickness and parallelism degree of the crystal plate meet the designated standards; ③ polishing: under a condition that the pressure and revolving speed of a polishing disk are controlled, polishing powder-water solution is used to process the thickness of the finely grinded crystal plates to make the thickness, parallelism degree, and aperture of the crystal plates meet the designated indexes;
(3) cleaning of crystal plates: automatic cleaning machine is used to clean the appearance of the crystal plates that are subject to the process in step (2);
(4) coating of crystal plates: ink is coated on the surface of the crystal plate 23; first, the number and time of revolutions of the spin-coating device are adjusted, and the amount of ink to be coated on the crystal plate is controlled; then, heat treatment is performed; finally, baking is performed to obtain a semi-finished product; by controlling the amount of ink coated, baking temperature, and baking time in step (4), the final product complies with the required spectral curve, and the half-value deviation of the spectrum is accurately controlled to be within ±1%;
(5) inspection and cleaning of semi-finished product: first, the appearance and the uniformity of the optical property distribution of the semi-finished product prepared in step (4) are inspected; then no-damage cleaning is performed to finalize the production of ink coating crystal plates.
(6) film coating: the vacuum coaling device is used to perform film coating on the crystal plate 21 at a normal or high temperature in the tolerance range of the ink to meet the usage requirement of the user.

In order to further optimize above technical feature, regarding the ink coating on the surface of the crystal plate in step (4), whether pre-processing is required is determined according to the visible light transmittance, the heat resistance, and the like of the product; the pre-processing includes the following steps. Firstly, the number of revolution of the spin-coating device is adjusted, then the pre-processing liquid is applied on the crystal plate, then heat treatment is performed; ink is coated after the pre-processing is finished.

In order to further optimize above technical features, in step (4), the number of revolutions of the spin-coating device is set to be 500 rpm∞4000 rpm.

In order to further optimize above technical features, in step (4), the baking temperature is set to be 85° C.~400° C.

In order to further optimize above technical features, in step (5), the thickness of the ink coating crystal plates 2 may be less than 0.1 mm.

Embodiment 2

Referring to the related drawings, the present invention provides a crystal coating optical low pass filter, which includes UV-IR cut-off film 1, a 0° crystal plate, ink layer 3, and AR film 4; wherein UV-IR cut-off film 1 can be replaced with an IR film.

In order to further optimize above technical feature, in view of different types of CCD and CMOS image sensor and the noises caused in different directions, the crystal plate can be replaced by any combination of crystal plates with diligent thicknesses, numbers, and angles.

In order to further optimize above technical features, ink layer 3 is coated on the crystal plate by a spin-coating device and the ink used has an infrared absorbing effect.

In order to further optimize above technical features, UV-IR cut-off film 1, AR film 4, and the IR film are evaporated by the vacuum coating device.

A method for manufacturing a crystal coating optical low pass filter includes the following steps:
(1) original stone cutting: cutting off a crystal at a 45° angle with respect to the Z axis of the crystal;
(2) grinding of crystal: ① rough grinding: under a condition that grinding pressure and grinding speed are controlled, for the cut-off crystal, rough grinding material is used to process the thickness of the crystal plate such that the thickness and parallelism degree of the crystal meet the designated requirements; ② fine grinding: under a condition that grinding pressure and grinding speed are controlled, fine grinding material is used to process the roughly grinded crystal plate to further make the thickness and parallelism degree of the crystal plate meet the designated standards; ② polishing under a condition that the pressure and revolving speed of a polishing disk are controlled, polishing powder-water solution is used to process the thickness of the finely grinded crystal plate to make the thickness, parallelism degree, and aperture of the crystal plate meet the designated indexes;

(3) cleaning of crystal plate: automatic cleaning machine is used to clean the appearance of the crystal plate that is subject to the process in step (2);

(4) coating of crystal plate: ink is coated on the surface of the crystal plate; first, the number and time of revolutions of the spin-coating device is adjusted, and the amount of ink to be coated on the crystal plate is controlled; then, heat treatment is performed; finally, baking is performed to obtain a semi-finished product; by controlling the amount of ink coated, baking temperature, and baking time in step (4), the final product complies with the required spectral curve, and the half-value deviation of the spectrum is accurately controlled to be within ±1%;

(5) inspection and cleaning of semi-finished product: first, the appearance and the uniformity of the optical property distribution of the semi-finished product prepared in step (4) are inspected; then no-damage cleaning is performed to finalize the production of ink coating crystal plate.

(6) film coating: the vacuum coating device is used to perform film coating on the crystal plate at a normal or high temperature in the tolerance range of the ink to meet the usage requirement of the user.

In order to further optimize above technical features, regarding the ink coating on the surface of the crystal plate in step (4), whether pre-processing is required is determined according to the visible light transmittance, the heat resistance, and the like of the product; the pre-processing includes the following steps. Firstly, the number of revolutions of the spin-coating device is adjusted, then the pre-processing liquid is applied on the crystal plate, then heat treatment is performed; ink is coated after the pre-processing is finished.

In order to further optimize above technical features, in step (4), the number of revolutions of the spin-coating device is set to be 500 rpm~4000 rpm.

In order to further optimize above technical features, in step (4), the baking temperature is set to be 85° C.~400° C.

In order to further optimize above technical features, in step (5), the thickness of the ink coating crystal plate may be less than 0.1 mm.

In the description, each embodiment is described in a progressive manner. The differences between this embodiment and other embodiments are significantly pointed out in each embodiment. The similarities of the embodiments can be seen by referring to each other. For the device disclosed by the embodiments, since it corresponds to the method disclosed by the embodiments, the description is simple. Please refer to the description regarding the method for details.

For above description of disclosed embodiments, those skilled in the art can implement or use the present invention. The modifications to these embodiments are obvious to those skilled in the art. The general principle defined in the specification can be achieved in other embodiments without going beyond the spirit or scope of the present invention. Therefore, the present invention will not be limited to the embodiments described herein and should be construed as the broadest scope complying with the principle and novel features disclosed in the specification.

What is claimed is:

1. A crystal coating optical low pass filter, comprising:
   a plurality of crystal plates having different cut angles with respect to an optical axis of the crystal coating optical low pass filter;
   a UV-IR cut-off film or an IR film attached to one side of one of the plurality of crystal plates;
   an ink layer attached to one side of another one of the plurality of crystal plates; and
   an AR film attached to the ink layer.

2. The crystal coating optical low pass filter according to claim 1, wherein the crystal plates are adhered by UV gel.

3. The crystal coating optical low pass filter according to claim 1, wherein the ink layer is coated on the crystal plate by a spin-coating device and has an infrared absorbing effect.

4. The crystal coating optical low pass filter according to claim 1, wherein the UV-IR cut-off film, the AR film, and the IR film are all evaporated by a vacuum coating device.

5. A method for manufacturing the crystal coating optical low pass filter of claim 1, wherein the method comprises the following steps:
   (1) cutting off a crystal at an angle with respect to a Z axis of the crystal to form a crystal plate;
   (2) under a condition that a grinding pressure and a grinding speed are controlled, using a rough grinding material to grind the crystal plate such that a thickness and a parallelism degree of the crystal plate meet designated requirements;
   (3) under a condition that the grinding pressure and the grinding speed are controlled, using a fine grinding material to grind the crystal plate to make the thickness and the parallelism degree of the crystal plate meet designated standards;
   (4) under a condition that a pressure and a revolving speed of a polishing disk are controlled, using a polishing powder-water solution to process the thickness of the crystal plate to make the thickness, the parallelism degree, and an aperture of the crystal plate meet designated indexes;
   (5) using an automatic cleaning machine to clean an appearance of the crystal plate;
   (6) coating ink on a surface of the crystal plate by:
       firstly, adjusting the number and time of revolutions of a spin-coating device and controlling the amount of ink to be coated on the crystal plate,
       then performing a heat treatment, and
       finally performing baking to obtain a semi-finished product;
   wherein the amount of ink coated, baking temperature, and baking time are controlled such that a final product complies with a required curve of spectrum and a half-value deviation of the spectrum is accurately controlled to be within ±1%;
   (7) inspecting and cleaning the semi-finished product by firstly, inspecting the appearance and an uniformity of optical property distribution of the semi-finished product; and
       then performing no-damage cleaning to finalize production of ink coating crystal plate;
   (8) using a vacuum coating device to perform film coating on the crystal plate at a normal or high temperature in a tolerance range of the ink to meet usage requirements of a user.

6. The method according to claim 5, wherein, regarding the ink coating on the surface of the crystal plate in step (6), whether pre-processing is required is determined according to visible light transmittance and heat resistance of the semi-finished product; wherein the pre-processing includes following steps:
   adjusting the number of revolutions of the spin-coating device, applying a pre-processing liquid on the crystal plate, and performing heat treatment on the crystal plate, and wherein the ink is coated after the pre-processing is finished.

7. The method according to claim 5, in step (6), the number of revolutions of the spin-coating device is set to be 500 rpm-4000 rpm.

8. The method according to claim 5, in step (6), the baking temperature is set to be 85° C.-400° C.

9. The method according to claim 5, in step (7), the thickness of the ink coating crystal plate is less than 0.1 mm.

* * * * *